United States Patent
Ogawa et al.

(10) Patent No.: US 6,259,393 B1
(45) Date of Patent: Jul. 10, 2001

(54) SEMICONDUCTOR INTEGRATED CIRCUIT AND DRIVING METHOD USING COMPARATOR FEEDBACK LOOP TO SWITCH SUBTRACTION BYPASS CIRCUIT

(75) Inventors: Katsuhisa Ogawa, Machida; Tadahiro Ohmi, Sendai; Tadashi Shibata, Tokyo, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/105,258

(22) Filed: Jun. 26, 1998

(30) Foreign Application Priority Data

Jul. 2, 1997 (JP) .................................................. 9-176865

(51) Int. Cl.$^7$ .............................. H03M 1/38; H03M 1/10
(52) U.S. Cl. ........................................... 341/161; 341/120
(58) Field of Search ..................................... 341/120, 143, 341/161, 156, 163

(56) References Cited

U.S. PATENT DOCUMENTS

| | | | |
|---|---|---|---|
| 4,994,808 | * | 2/1991 | Wichelman ............................ 341/161 |
| 5,027,116 | * | 6/1991 | Armstrong et al. .................. 341/120 |
| 5,349,595 | | 9/1994 | Ogawa et al. . |
| 5,995,035 | * | 11/1999 | Signell et al. ......................... 341/163 |
| 6,028,546 | * | 2/2000 | Signell et al. ......................... 341/161 |

\* cited by examiner

*Primary Examiner*—Patrick Wamsley
(74) *Attorney, Agent, or Firm*—Fitzpatrick, Cella, Harper & Scinto

(57) ABSTRACT

In order to solve the problem of increase in circuit scale and increase in power consumption due to use of a DA converter, a semiconductor integrated circuit comprises a signal amplifier 2, 10 capable of switching of a gain to 1 or 2, an arithmetic processor 7, 9 for performing a subtraction process of a reference voltage from an input signal to output a result thereof or for outputting the input signal without performing the subtraction process, a switch 8 whose one switch terminal is connected to a signal input terminal, whose other switch terminal is connected to an output side of sample hold circuits 5, 6, and whose common terminal is connected to an input side of the arithmetic processor, a comparator 3 for comparing an output from the signal amplifier with the reference voltage to binarize the output, and a switch 11 for connecting an output side of the signal amplifier to an input side of the sample hold circuits, wherein the arithmetic processor carries out a changeover between the operation of performing the subtraction process of the reference voltage from the input signal to output the result and the operation of outputting the input signal without performing the subtraction process, based on an output from the comparator, thereby decreasing the circuit scale and substantially eliminating occurrence of an error.

18 Claims, 6 Drawing Sheets

SEMICONDUCTOR INTEGRATED CIRCUIT AND DRIVING METHOD USING COMPARATOR FEEDBACK LOOP TO SWITCH SUBTRACTION BYPASS CIRCUIT

BACKGROUND OF THE INVENTION

1. Field of the Invention

The present invention relates to a semiconductor integrated circuit and a driving method thereof and, more particularly, to a semiconductor integrated circuit suitably applicable to a successive comparison A-D converter, and a driving method thereof.

2. Related Background Art

With present development of digital signal processing, the A-D converters for converting an analog signal to a digital signal are important technology and the A-D converters of various methods (hereinafter referred to as AD converters) have been developed heretofore. Particularly in high-speed applications, the mainstream converters are flash AD converters wherein there are comparison voltages corresponding to all levels of a quantization range and in the case of N-bit conversion, the converter has (2N-1) comparators for concurrent comparison and encoding. Since the number of comparators was large, such AD converters were not suitable for applications to portable remote terminals and the like requiring low power consumption. Therefore, the successive comparison AD converters, which are AD converters of low power consumption, have widely been and are used.

FIG. 1 is a block diagram to show an example of the successive comparison AD converter. An analog signal to be converted is applied to input terminal 50 to be input to a (+) input terminal of comparator 51. Connected to a (−) input terminal of the comparator 51 is an output of D-A converter 54 whose input bit is set by successive comparison register 53 and which generates a comparison analog voltage.

A control circuit 52 sets a value of the successive comparison control register 53, based on a result of the comparator 51, to control the output of the DA converter 54. In the successive comparison AD converter, the analog signal input is successively converted bit by bit from MSB (Most Significant Bit) into a digital code. Let us consider successive comparison of N bits. In response to a control signal from the control circuit 52, the successive comparison register sets 1 at the N-th bit, which is the MSB, and 0 to the other bits. This code is applied to the DA converter 54 to be converted into an analog comparison signal Vda. In this case, the analog comparison signal Vda is generated as a voltage equal to a half of the entire quantization range, which is compared with the analog input signal Vin applied to the input terminal 50. When Vin>Vda, the output from the comparator 51 becomes "H" to be sent to the control circuit 52. Receiving "H", the control circuit 52 rewrites the data in the successive comparison register so as to set 1 to the lower bit (MSB-1) while maintaining 1 in the MSB, which is the bit having been compared so far, and then sends the result to the DA converter 54. In this case, the MSB bit is determined to be 1 and the next comparison operation is carried out with setting 1 in the (MSB-1) bit. When Vin<Vda, the output of the comparator 51 is "L" and is sent to the control circuit 52. Receiving "L", the control circuit 52 rewrites the data in the successive comparison register so as to change the MSB, which is the bit having been compared so far, from 1 to 0 and set 1 in the lower bit (MSB-1), and sends the result to the DA converter 54. In this case, the MSB bit is determined to be 0, and then the next comparison operation is carried out with setting 1 in the (MSB-1) bit. This operation is repeated while performing the comparison and register setting in order from the upper bit to the lower bit, so that the data of the successive comparison register finally becomes a binary code resulting from the A-D conversion of the analog input signal Vin applied to the input terminal 50.

For configuring a successive comparison AD converter with many bits, however, the successive comparison AD converter shown in FIG. 1 was not suitable because the number of bits of the DA converter 54 for generating the analog comparison voltage needed to be the same as the number of bits of the AD converter, resulting in increasing the circuit scale and in turn increasing power consumption. The conversion accuracy of the AD converter of the successive conversion method was mainly dependent upon errors of the DA converter 54, and the increase in the number of bits degraded the accuracy of DA converter 54. As a result, the AD convertor came to lack monotonicity and make a coding error.

SUMMARY OF THE INVENTION

An object of the present invention is to provide a semiconductor integrated circuit that can perform highly accurate A-D conversion by a simple circuit configuration, and a driving method thereof.

Another object of the present invention is to provide a semiconductor integrated circuit that can perform the A-D conversion operation with low power consumption and in high integration without increase in the circuit scale, and a driving method thereof.

Still another object of the present invention is to provide a semiconductor integrated circuit comprising: signal amplifying means (2, 10 in FIG. 2) capable of switching a gain, preferably, to 1 or 2; arithmetic processing means (7, 9 in FIG. 2) connected to an input side of the signal amplifying means, the arithmetic processing means carrying out a subtraction process of a reference voltage from a signal input thereto to output a result of the subtraction process, or outputting the signal input thereto without performing the subtraction process; changeover means (8 in FIG. 2) whose one changeover terminal is connected to a signal input terminal (1 in FIG. 2) and whose other changeover terminal is connected to an output side of sample hold means (5, 6 in FIG. 2), a common terminal of the changeover means being connected to an input side of the arithmetic processing means; a comparator (3 in FIG. 2) connected to an output side of the signal amplifying means, the comparator comparing an output from the signal amplifying means with the reference voltage (12 in FIG. 2) to binarize the output; and switch means (11 in FIG. 2) connecting the output side of the signal amplifying means to an input side of the sample hold means;

wherein the arithmetic processing means (7, 9 in FIG. 2) carries out a changeover (a changeover of 9 in FIG. 2) between performing the subtraction process of the reference voltage from the signal input thereto to output the result and outputting the signal input without performing the subtraction process, based on an output from the comparator (3 in FIG. 2).

Another object of the present invention is to provide a semiconductor integrated circuit comprising: signal amplifying means (2 in FIG. 4) capable of switching a gain, preferably, to 1 or 2 and capable of performing a changeover between performing a subtraction process of a reference voltage from a signal input thereto to output a result of the subtraction process and outputting the signal input thereto without performing the subtraction process; changeover means (8 in FIG. 4) whose one changeover terminal is connected to a signal input terminal (1 in FIG. 4) and whose other changeover terminal is connected to an output side of sample hold means (5, 6 in FIG. 4), a common terminal of the changeover means being connected to an input side of the signal amplifying means; a comparator (3 in FIG. 4) connected to an output side of the signal amplifying means, the comparator comparing an output from the signal amplifying means with the reference voltage (12 in FIG. 4) to binarize the output; and switch means (11 in FIG. 4) connecting the output side of the signal amplifying means to an input side of the sample hold means; wherein the signal amplifying means (2 in FIG. 4) carries out the changeover (a changeover of 9 in FIG. 4) between performing the subtraction process of the reference voltage from the signal input thereto to output the result and outputting the signal input thereto without performing the subtraction process, based on an output from the comparator (3 in FIG. 4).

Still another object of the present invention is to provide a method for driving a semiconductor integrated circuit comprising: signal amplifying means capable of switching a gain; arithmetic processing means connected to an input side of the signal amplifying means, the arithmetic processing means carrying out a subtraction process of a reference voltage from a signal input thereto to output a result of the subtraction process, or outputting the signal input thereto without performing the substraction process; changeover means whose one changeover terminal is connected to a signal input terminal and whose other changeover terminal is connected to an output side of sample hold means, a common terminal of the changeover means being connected to an input side of the arithmetic processing means; a comparator connected to an output side of the signal amplifying means, the comparator comparing an output from the signal amplifying means with the reference voltage to binarize the output; and switch means connecting the output side of the signal amplifying means to an input side of the sample hold means; wherein the arithmetic processing means carries out a changeover between performing the subtraction process of the reference voltage from the signal input thereto to output the result and outputting the signal input thereto without performing the subtraction process, based on an output from the comparator, the driving method comprising an MSB (Most Significant Bit) conversion mode in which the gain of the signal amplifying means is set to 1 and the changeover means electrically connects the signal input terminal to the input side of the arithmetic processing means.

A further object of the present invention is to provide a method for driving a semiconductor integrated circuit comprising: signal amplifying means capable of switching a gain and capable of performing a changeover between performing a subtraction process of a reference voltage from a signal input thereto to output a result of the subtraction process and outputting the signal input thereto without performing the subtraction process; changeover means whose one changeover terminal is connected to a signal input terminal and whose other changeover terminal is connected to an output side of sample hold means, a common terminal of the changeover means being connected to an input side of the signal amplifying means; a comparator connected to an output side of the signal amplifying means, the comparator comparing an output from the signal amplifying means with the reference voltage to binarize the output; and switch means connecting the output side of the signal amplifying means to an input side of the sample hold means; wherein the signal amplifying means carries out the changeover between performing the subtraction process of the reference voltage from the signal input thereto to output the result and outputting the signal input thereto without performing the subtraction process, based on an output from the comparator, the driving method comprising an MSB (Most Significant Bit) conversion mode in which the gain of the signal amplifying means is set to 1 and the changeover means electrically connects the signal input terminal to the input side of the signal amplifying means.

The present invention can realize the successive conversion operation by comparing an input analog signal with the reference voltage 12 of the reference power supply and feeding the input analog signal as it is or a difference resulting from the subtraction of the reference voltage value therefrom back to the input, based on the comparison result; therefore, the present invention can achieve the simple circuit of low power consumption using only the comparator but necessitating no DA converter. This permits the highly accurate successive conversion AD converter to be constructed without increase in hardware against increase in the number of conversion bits.

In a preferred embodiment of the present invention, the gain of the signal amplifying means 2 is set to 1 in the MSB conversion mode where the first changeover means 8 electrically connects the signal input terminal 1 to the input side of the arithmetic processing means (7, 9 in FIG. 2) or the signal amplifying means (2 in FIG. 4), or the gain of the signal amplifying means 2 is set to 2 in the conversion mode except for the MSB conversion mode, where the first changeover means electrically connects the signal input terminal to the output side of the sample hold circuit.

This setup realizes the successive comparison AD converter with the reduced number of circuit elements, which can be set in each bit conversion mode simply by switching the gain of the signal amplifying means between in the MSB conversion mode and in the conversion mode except for the MSB conversion mode.

In a preferred embodiment of the present invention, after such an operation that a signal before AD conversion is applied to the signal input terminal 1, that the signal is amplified by a factor of 1 or 2 by the signal amplifying means 2, and that a binary comparison operation of the comparator 3 is completed, first switch means 11 is switched on, whereby either after execution of the subtraction process of subtracting a signal of the reference voltage from the signal before the AD conversion when the output of the comparator is active or after execution of an arithmetic process of not performing the subtraction process of the signal of the reference voltage from the signal before the AD conversion when the output of the comparator is non-active, an output from the signal amplifying means is supplied to the sample hold circuit 5.

This setup achieves highly accurate AD conversion even with increase in the number of conversion bits using only a 1-bit AD converter in terms of the hardware in such a way that the suitable processes are carried out for the input analog signal to be converted, based on the quantized result, by use of one comparator or 1-bit AD converter and the signal is held as input information of the next conversion bit.

In a preferred embodiment of the present invention, the signal amplifying means comprises an operational amplifier (2 in FIG. 4), a non-inverting input terminal of the operational amplifier is connected through first capacitor means (23 in FIG. 4) to second changeover means (20 in FIG. 4), one terminal of the second changeover means is connected to a second reference power supply (27 in FIG. 4), the other terminal is connected to an output of the first changeover means (8 in FIG. 4), an inverting input terminal of the operational amplifier is connected through second capacitor means (24 in FIG. 4) to third changeover means (9 in FIG. 4) and also connected through third capacitor means (25 in FIG. 4) to the output of the operational amplifier, one terminal of the third changeover means is connected to the ground potential (27 in FIG. 4), the other terminal is connected to the first reference power supply (12 in FIG. 4), and the third changeover means is controlled by a binary output from the comparator.

This setup permits the difference between the input voltage value and the reference voltage value to be input accurately by alternate writing of the reference voltage value and the input signal value through the first capacitor means connected to the non-inverting input terminal of the operational amplifier, thus realizing the accurate signal processing without being affected by the offset of the operational amplifier or the like. Since the conversion operation of the compared input analog signal to the lower bit can be realized by the simple control and circuit configuration wherein the circuit has the switch (changeover means) connected through the second capacitor means connected to the inverting terminal of the operational amplifier to the ground potential or to the reference voltage value and wherein the switch is flipped to the reference voltage value in the reset mode or either to the reference voltage value or to the ground potential after the AD conversion, based on the output result of the comparator or 1-bit AD converter, the accuracy of range conversion can be improved remarkably and the number of quantization conversion bits of the successive comparison AD converter can be increased greatly.

In a preferred embodiment of the present invention, the third changeover means (9 in FIG. 4) is connected to the first reference power supply (12 in FIG. 4) when the binary output of the comparator (3 in FIG. 4) is active; whereas the third changeover means is connected to the ground potential (27 in FIG. 4) when the binary output is non-active.

In this setup, according to the bit conversion result, with the bit output of "H" the voltage equal to a half of the full range is subtracted from the input analog signal and the result is returned to the feedback loop; with the bit output of "L" the input analog signal is returned to the feedback loop without any process, whereby only one stage of the capacitance-coupled operational amplifier can perform the subtraction process etc. necessary for comparison of the next bit output, which enhances the accuracy, which realizes the processing circuit without a need for a special circuit, and which decreases the power consumption.

As described above, the present invention employs the signal loop circuit configuration using the capacitance-coupled operational amplifier, sample hold circuits, and 1-bit quantizing comparator to perform the quantization judgment in order from the MSB of the upper bit, thereafter perform the subtraction process from the input analog signal, based on the quantization result, perform the range expanding process, and feed the analog signal after these processes back to the input, and then perform the quantization operation of the next bit, whereby the analog processing can be carried out with high accuracy by the simple configuration including the one-stage capacitance-coupled operational amplifier and sample hold circuits, thereby realizing the successive comparison AD converter for a string of many bits in the small circuit scale, in high integration, and with low power consumption while drastically improving the quantization conversion error.

The configurations according to the present invention were described above referring to FIG. 2 and FIG. 4, but it should be noted that the present invention is by no means intended to be limited to only the configurations of FIG. 2 and FIG. 4 nor to the embodiments described hereinafter. A variety of modifications and combinations can also be suitably contemplated according to the necessity within the spirit and scope of the present invention.

DETAILED DESCRIPTION OF THE PREFERRED EMBODIMENTS

The embodiments of the present invention will be described in detail by reference to the drawings.

First Embodiment

Figure 2:
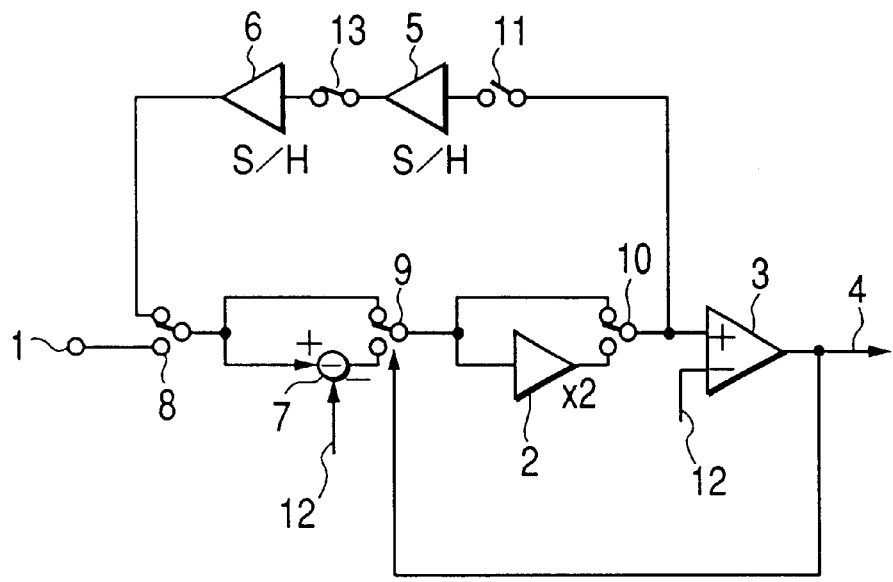
FIG. 2 is a schematic circuit diagram for explaining an example of the semiconductor integrated circuit according to the present invention.

FIG. 2 is a schematic circuit diagram t o show the first embodiment of the present invention. In FIG. 2, an analog signal to undergo the A-D conversion is applied to the input terminal 1 to be input through switches 8, 9, 10 to a non-inverting input terminal (+input terminal) of comparator 3. A reference voltage is applied from a reference power supply 12 to an inverting input terminal (−input terminal) of the comparator 3. When the analog signal applied to the input terminal 1 is larger than the reference voltage of the reference power supply 12, the output of the comparator 3 becomes "H"; when smaller, the output of the comparator 3 becomes "L". The reference power supply 12 is a dc voltage source having a voltage value (Vref) equal to a half of a voltage full range Vfull which the analog signal to undergo the AD conversion can take. Namely, the relation of Vref= Vfull/2 exists. Since the successive comparison AD converter in the present embodiment performs the AD conversion successively from the most significant bit MSB, the operation in the above description is the one in a mode upon conversion of MSB. When the analog signal applied to the input terminal 1 is larger than the reference voltage of the reference power supply 12 and thus the output of the comparator 3 is "H", a quantizing value of MSB is determined to be 1 and the switch 9 is controlled so that an output of the switch 9 is an output of a subtractor 7 for subtracting the reference voltage value of the reference power supply 12 from the analog signal applied to the input terminal 1.

As a preparation operation for AD conversion of a lower bit, the signal passes through signal amplifier 2 for doubling the analog signal having undergone subtraction, so as to be amplified twice and expand the range. The amplified signal becomes an output of the switch 10. When the analog signal applied to the input terminal 1 is smaller than the reference voltage of the reference power supply 12 and thus the output of the comparator 3 is "L", a quantizing value of MSB is determined to be 0 and the switch 9 is controlled so that the analog signal applied to the input terminal 1 is outputted as an output of the switch 9 as it is. As a preparation operation for AD conversion of a lower bit, the signal then passes through the signal amplifier 2 for doubling the analog signal being the output of the switch 9, so as to be amplified twice and expand the range. The amplified signal is outputted as an output of the switch 10. The analog signal thus processed for conversion of the lower bit is supplied through switch 11 to a first sample hold circuit (S/H) 5 to be held there temporarily. After completion of the quantization operation in the AD conversion section, the switch 11 is switched off and switch 13 is switched on whereby the analog signal for AD conversion of the next bit is input into a second sample hold circuit (S/H) 6. Then the switch 13 is switched off to hold this value. Then the switch 8 turns into a mode for supplying an output of the sample hold circuit 6 to the AD conversion section. In the processes of the other bits than the MSB, the output of the sample hold circuit 6 is set to be an output of switch 8. Namely, in the processes of the other bits than the MSB the output signal of the AD conversion section is fed through the sample hold circuits 5, 6 back to the input of the AD conversion section.

Figure 3:
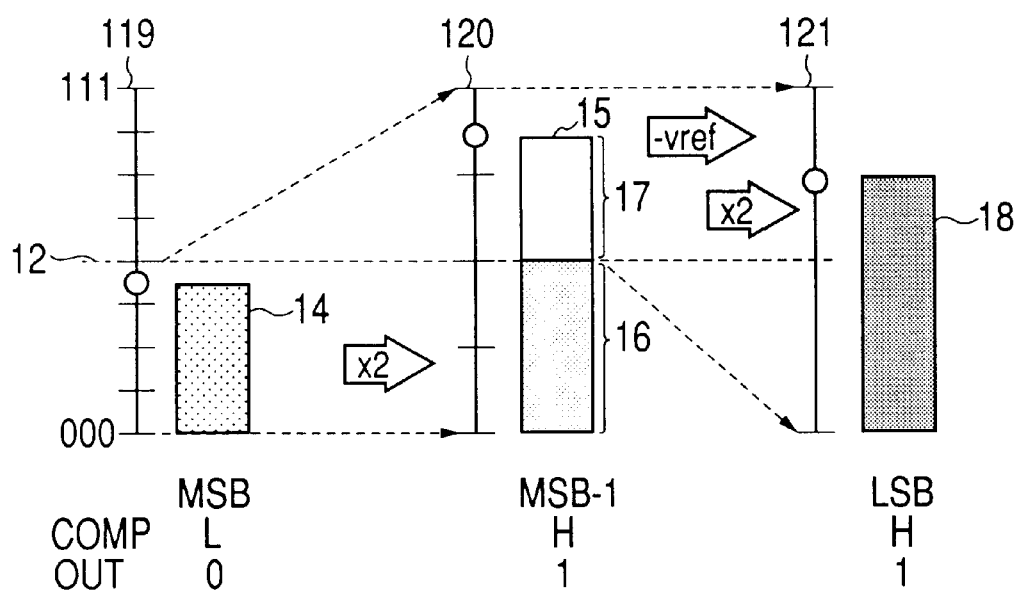
FIG. 3 is a drawing for explaining an example of the operation in the circuit shown in FIG. 2.

FIG. 3 is a drawing for explaining the AD conversion architecture of the present embodiment. The illustration of FIG. 3 is an example where the successive comparison AD converter is of three bits in the present embodiment, but it is a matter of course that the AD converters according to the present invention are not limited to this number of bits.

The analog signal applied to the input terminal 1 in FIG. 2 is indicated by 14 in FIG. 3. Numeral 119 designates the quantization range of the input analog signal in the MSB, and the quantization range is equally divided into three bits, i.e., into eight levels. Quantization representative points 000 to 111 are assigned to the respective quantization levels. The reference potential, Vref, of the reference power supply 12 in the comparator of FIG. 2 is located at the center of the quantization range 119. When the signal surpasses this value, the output of the comparator 3 of FIG. 2 becomes "H" whereby the quantization code of the MSB is determined to be "1". When the input analog signal does not surpass this value, the output of the comparator 3 becomes "L" and the quantization code of the MSB is determined to be "0". In the example of FIG. 3, because the input analog signal 14 is smaller than the reference potential Vref 12, the output of the comparator (Comp) 3 becomes "L" and the MSB is determined to be "0".

For next carrying out quantization of the (MSB1) bit being the next lower bit, the signal is supplied to the signal amplifier 2 having the gain of 2 without passing the subtractor 7 of FIG. 2, because the analog signal in the MSB was smaller than the reference potential Vref 12 and thus the output of the comparator 3 was "L". The signal undergoes analog amplification by the signal amplifier 2 to expand the range twice, thus becoming the analog signal indicated by 15 in FIG. 3. This signal is fed through the sample hold circuits 5, 6 of FIG. 2 back to the input of the AD conversion section to undergo the AD conversion of the (MSB-1) bit. Since the signal this time is the one after expansion of the range, the quantization range 120 for the analog signal 15 of FIG. 3 input into the AD conversion section is double the levels below the reference potential Vref 12 of the quantization range 119 for the MSB, whereby quantization of the (MSB-1) bit is realized. Since the quantization range 120 is expanded to double the quantization range 119, the quantization range has the quantization levels obtained by quartering the full range. The reference potential Vref 12 of the reference power supply at the comparator 3 of FIG. 2 is located at the center of the quantization range 120. When the signal surpasses this value, the output of the comparator 3 of FIG. 2 becomes "H" and the quantization code of (MSB-1) is determined to be "1". When the input analog signal is smaller than this value, the output of the comparator 3 becomes "L" and the quantization code of (MSB-1) is determined to be "0". Since in the example of FIG. 3 the input analog signal 15 is larger than the reference potential Vref 12, the output of the comparator 3 is "H" and (MSB-1) is determined to be "1".

For next quantizing the (MSB-2) bit being the next lower bit, because the analog signal 15 in the (MSB-1) was over the reference potential Vref 12 and thus the output of the comparator 3 was "H", an analog signal 17, resulting from subtraction of a portion of the analog signal 15 corresponding to the reference potential Vref 12 from the analog signal 15 input to the subtractor 7 of FIG. 2, undergoes analog amplification by the signal amplifier 2 having the gain of 2, so as to double the range, thus becoming an analog signal 18 shown in FIG. 3. Then the analog signal 18 is fed through the sample hold circuits 5, 6 of FIG. 2 back to the input of the AD conversion section to undergo the AD conversion for the bit of MSB-2 (LSB). Since the signal at this time is the one after expansion of the range, the quantization range 121 for the analog signal 18 of FIG. 3 input to the AD conversion section is double the levels above the reference potential Vref 12 of the quantization range 120 for the (MSB-1), thus realizing the range expanding operation for quantization of the (MSB-2) bit. Since the quantization range 121 is twice larger than the quantization range 120, the quantization range 121 has quantization levels obtained by halving the full range, and the reference potential Vref 12 of the reference power supply at the comparator 3 in FIG. 2 is located at the center of the quantization range 121. When the signal surpasses this value, the output of the comparator 3 of FIG. 2 becomes "H", so that the quantization code of MSB-2 (LSB) is determined to be "1". When the input analog signal is smaller than this value, the output of the comparator 3 becomes "L" and the quantization code of MSB-2 (LSB) is determined to be "0". In the example of FIG. 3 where the input analog signal 18 is larger than the reference potential Vref 12, the output of the comparator 3 is "H" and MSB-2 (LSB) is determined to be "1". This completes the successive comparison of MSB, MSB-1, and MSB-2 (LSB) to encode the input signal to the AD conversion code of 011.

Figure 1:
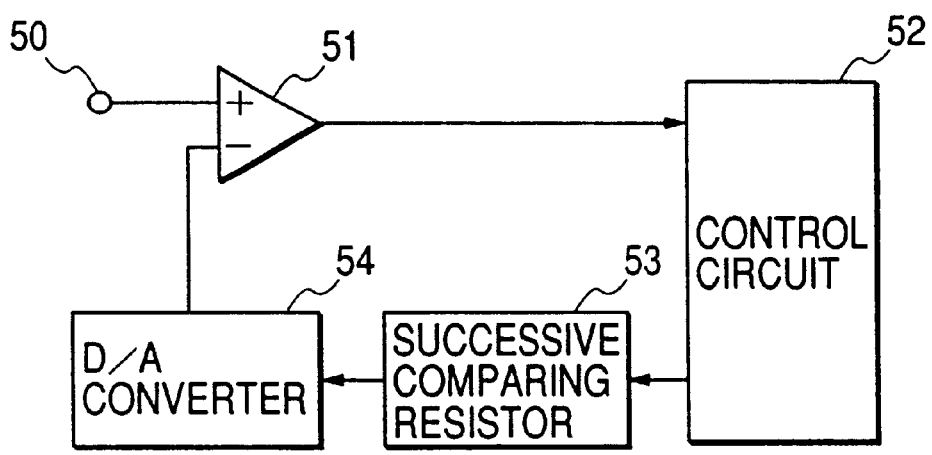
FIG. 1 is a schematic circuit diagram for explaining an example of the successive comparison AD converter.

As described above, it becomes possible to perform highly accurate successive comparison by such a simple circuit configuration as to expand the range of the analog signal after the AD conversion, feed the range-expanded signal back to the AD conversion section by the feedback loop, and again subject the signal to the AD conversion. Accordingly, the DA converter 54 shown in FIG. 1 is not necessary; and with increase in the number of quantizing bits of the AD conversion, to achieve high accuracy was difficult by the circuit configuration of FIG. 1 because the accuracy of the AD conversion was determined by the conversion accuracy of the internal DA converter 54; whereas the present embodiment is arranged so that the accuracy of the AD conversion is determined only by the subtraction accuracy of the subtractor 7 and the determination accuracy of the signal amplifier 2 for expansion of range and the comparator 3, and thus increase in the number of quantization bits will not result in increasing quantization errors of the AD conversion, thus realizing the highly accurate successive comparison AD converter of many bits.

Second Embodiment

Figure 4:
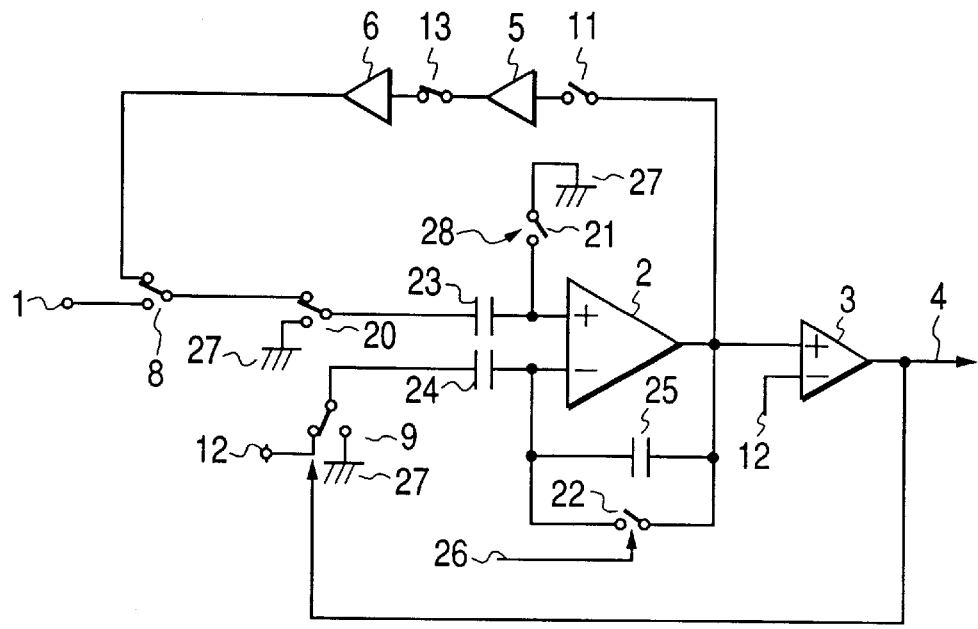
FIG. 4 is a schematic circuit diagram for explaining another example of the semiconductor integrated circuit according to the present invention.

FIG. 4 is a schematic circuit diagram to show the second embodiment of the present invention. In FIG. 4, an analog signal to undergo the AD conversion is applied to the input terminal 1 to be input to switch 8. The other input of the switch 8 is connected to second sample hold circuit 6, in which an analog conversion signal after MSB is held. An output of the switch 8 is input to switch 20 and the other input of the switch 20 is connected to the ground potential 27. An output of the switch 20 is connected to first capacitor 23 and the other terminal of the first capacitor 23 is connected to a non-inverting input terminal (+input terminal) of operational amplifier 2. Connected to an inverting input terminal (−input terminal) of the operational amplifier 2 is a common connection point between one terminal of second capacitor 24 and one terminal of third capacitor 25, and the other terminal of the third capacitor 25 is connected to the output of the operational amplifier 2, thus forming a feedback loop of capacitive coupling. The other terminal of the second capacitor 24 is connected to the output of switch 9, one input terminal of the switch 9 is connected to the reference power supply 12, and the other input terminal thereof is connected to the ground potential 27. A control terminal of the switch 9 is controlled by the output of comparator 3, and the signal subtraction operation is carried out here. The output of the operational amplifier 2 is connected through switch 22 to the inverting input terminal of the operational amplifier 2. When a reset control signal 26 becomes active, the operational amplifier 2 is set into a mode of voltage follower of gain 1. A common connection point between the non-inverting input terminal of the operational amplifier 2 and the first capacitor 23 is connected through switch 21 to the ground potential 27. The switch 21 is turned on by a reset control signal 28 to reset the non-inverting input terminal of the operational amplifier 2 to the ground potential 27. The output of the operational amplifier 2 is connected to the non-inverting input terminal of comparator 3 and to switch 11. The reference voltage Vref 12 of the reference power supply is applied to the inverting input terminal of the comparator 3. When the output of the operational amplifier 2 is larger than the reference potential Vref 12, the comparator outputs "H"; when smaller, it outputs "L". This output of the comparator 3 is a quantized output of the input analog signal undergoing successive comparison, and is also the control signal of the switch 9 to control postprocessing (subtraction or doing nothing) of the input analog signal after the AD conversion. The signal having undergone the postprocessing of the input analog signal after the AD conversion passes the switch 11 to be input to the first sample hold circuit 5 and be held as an analog signal for AD conversion of the next bit. The held signal is input through the switch 13 into the second sample hold circuit 6, and the analog signal Vin for AD conversion of the bit after the MSB is circularly fed back from the output of the second sample hold circuit 6 through the switch 8 to the input portion.

Figure 5:
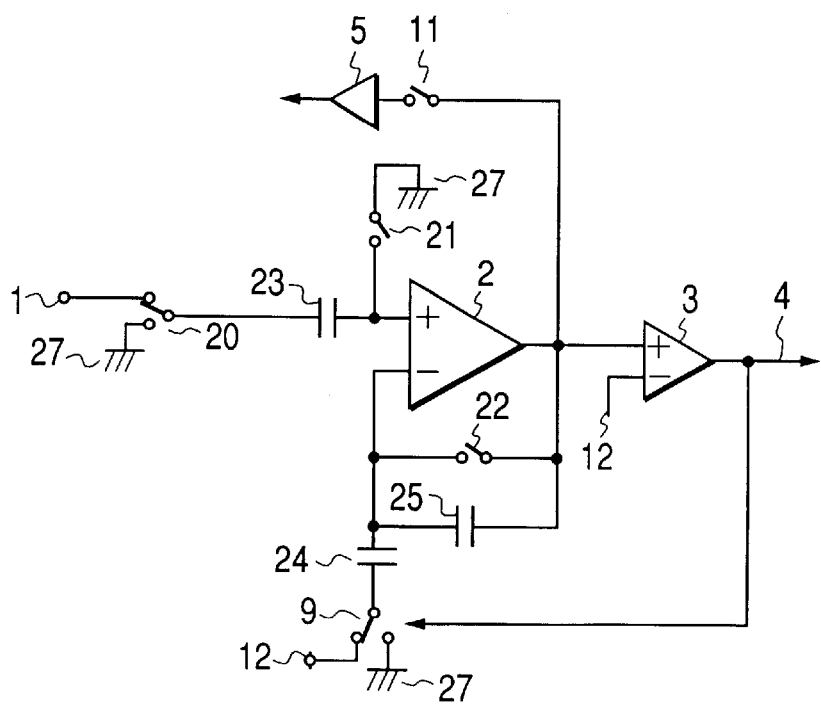
FIGS. 5, 6, 7 and 8 are circuit diagrams for explaining an example of the operation in the circuit shown in FIG. 4.

The operation in each mode will be described referring to the drawings. The circuit operation in the conversion of MSB will be described referring to FIG. 5 to FIG. 8. In FIG. 4, the switch 8 is flipped to the side of the input terminal 1 to first apply an analog signal to undergo the AD conversion to the input terminal of the switch 20. An equivalent circuit at this time is shown in FIG. 5.

The circuit always has a reset mode prior to the arithmetic operation, to set an initial value of each capacitor. The switch 20 is connected to the ground potential 27, the switch 21 is switched on to be connected to the ground potential 27, and the switch 22 is switched on to short the output and the inverting input terminal of the operational amplifier 2 to fix the operational amplifier 2 in the mode of voltage follower.

Figure 6:
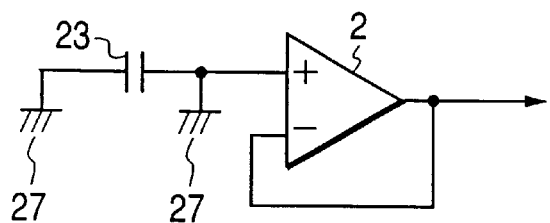

The switch 9 is connected to the ground potential 27. FIG. 6 is an equivalent circuit diagram upon the reset before the MSB conversion. The both terminals of the first capacitor 23 are connected to the ground potential 27, the inverting input terminal of the operational amplifier 2 is shorted to the output thereof to compose the voltage follower, and the non-inverting input terminal of the operational amplifier 2 is connected to the ground potential 27; therefore, the output of the operational amplifier 2 is also at the same potential as the ground potential 27.

Figure 7:
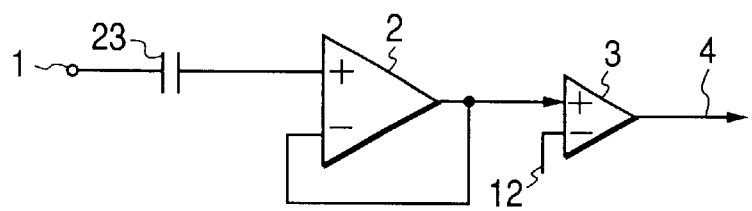

Then the switch 20 is flipped to the side of the input terminal 1 to take in the input analog signal and perform the quantizing operation thereof. This signal input-comparison mode is shown in FIG. 7. The input terminal 1 is connected to one terminal of the first capacitor 23 and the potential of the terminal of the capacitor changes from the ground potential to that of the analog signal input. Since the switch 21 connected to the other terminal of the capacitor 23 is switched off, the non-inverting input terminal of the operational amplifier 2 is at high impedance and this point becomes floating. Since the potential at this point changes by the same as the change of the potential at the input terminal of the first capacitor 23, the output of the operational amplifier 2 becomes equal to Vin. The comparator 3 receives this Vin to compare it with the reference voltage Vref 12 of the reference power supply, which is the voltage equal to a half of the input analog full range. When Vin is larger than the reference voltage Vref 12, the comparator outputs "H" to determine the quantization code of MSB to be "1". When Vin is smaller than the reference voltage Vref 12, the comparator outputs "L" to determine the quantization code of MSB to be "0". Then the comparator outputs the result to the output terminal 4.

Figure 8:
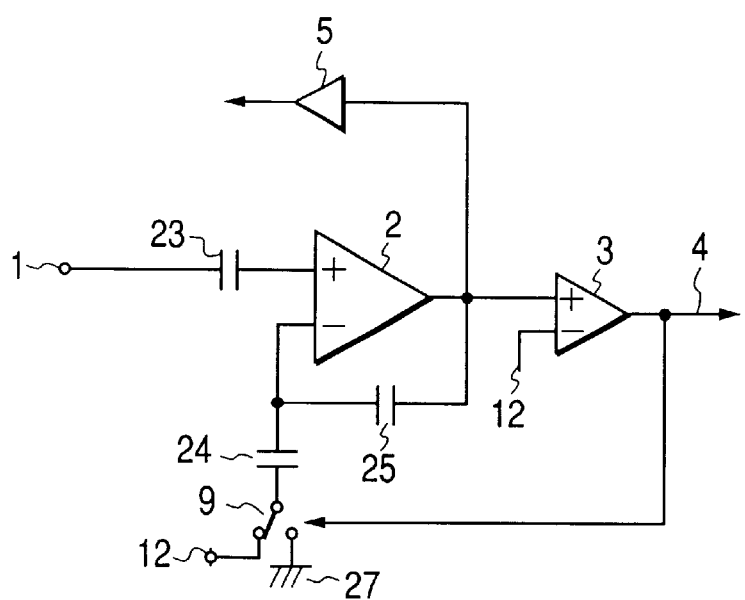

The circuit completes the MSB conversion operation here and moves to the preparation and range expansion operation for conversion of MSB-1. FIG. 8 is an equivalent circuit diagram of the postprocessing and range expansion operation mode. The output 4 of the comparator 3 is connected to the control terminal of the switch 9. When Vin is smaller than the reference voltage Vref 12, "L" is input to the control terminal of the switch 9 and the switch 9 is kept in the connected state to the ground potential 27. At this time, the switch 22 is switched off, so that the third capacitor 25 is connected between the inverting input terminal and the output of the operational amplifier 2. The capacitances of the second capacitor 24 and the third capacitor 25 are set equal to each other. At the same time as the off of the switch 22, the gain of the operational amplifier 2 is set to 2, and thus the operational amplifier 2 doubles the input analog signal Vin used for the conversion of MSB and outputs the doubled signal. At this time, the switch 11 is switched on during the transition of from 1 to 2 of the gain of the operational amplifier 2, and is switched off when the output becomes stable after the setting of the gain to 2. This sampling operation causes the first sample hold circuit 5 to hold the voltage of double Vin used for the comparison of MSB, and the voltage is circularly fed back to the analog input terminal of the AD conversion section upon the quantization operation of the next lower bit. When Vin is larger than the reference voltage Vref 12 of the reference power supply, "H" is input to the control terminal of the switch 9, so that the switch 9 switches the input from the ground potential 27 to the reference voltage Vref 12. At this point, the switch 22 is switched off and thus the third capacitor 25 is connected between the inverting input terminal and the output of the operational amplifier 2. The capacitances of the second capacitor 24 and the third capacitor 25 are set equal to each other. At the same time as the off of the switch 22, the switch 9 also transitions from the ground potential 27 to the reference voltage Vref 12, so that the operational amplifier 2 doubles (Vin-Vref), which is the result of subtraction of Vref from Vin, and outputs the result. At this time, the switch 11 is kept on during a period in which the floating point of the operational amplifier 2 achieves the calculation of Vin-Vref and the gain transitions from 1 to 2, and the switch 11 is switched off when the output becomes stable after the setting of the gain to 2. This sampling operation causes the first sample hold circuit 5 to hold the value of double the voltage resulting from the subtraction of Vref from Vin compared on the occasion of the MSB, and the held voltage is circularly fed back to the analog input terminal of the AD conversion section upon the quantization operation of the next lower bit.

As described above referring to FIG. 5 to FIG. 8, after the MSB conversion using the capacitance-coupled operational amplifier, the input analog signal having undergone the signal amplification with the process gain 1 is compared with the reference voltage Vref 12 and quantized by the comparator 3 and, for the process of the next (MSB-1) bit, the input analog signal undergoes the postprocessing (doing nothing when the quantization code is "0" or performing the subtraction of Vin-Vref when the quantization code is "1") and the range expanding process (doubling the analog signal after the postprocessing to match the signal with the scale for the next (MSB-1) bit which next undergoes the AD conversion) to be circularly fed back through the sample hold circuits to the input.

The architecture after the MSB, particularly the architecture for the AD conversion of (MSB-1) bit will be described using FIG. 9 to FIG. 12.

Figure 9:
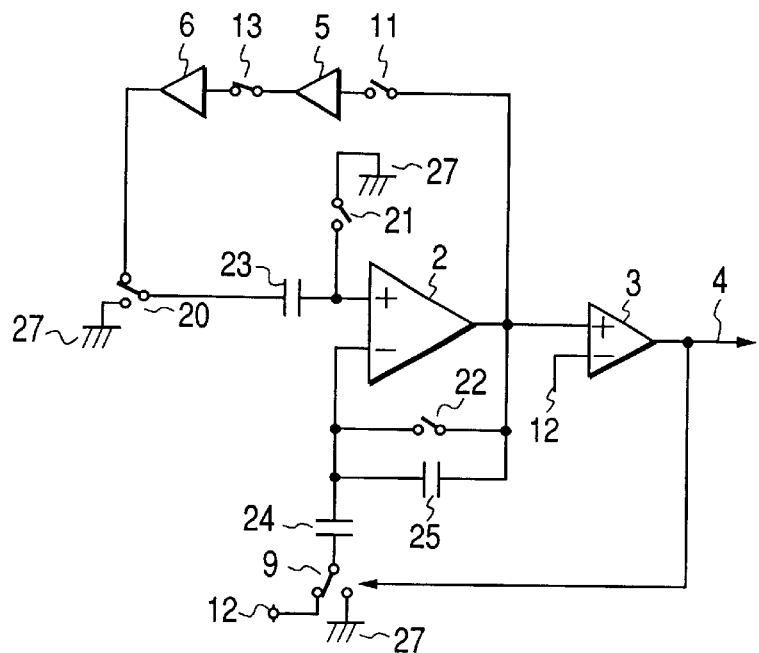
FIGS. 9, 10, 11 and 12 are circuit diagrams for explaining an example of the operation in the circuit shown in FIG. 4 after the MSB (Most Significant Bit).

FIG. 9 illustrates an equivalent circuit during the AD conversion of MSB-1. The switch 8 is flipped to the output side of the second sample hold circuit 6 holding the analog signal voltage for the (MSB-1) bit after the postprocessing and range expansion process, thereby inputting this signal as an analog signal for the next AD conversion. The switch 13 is kept off to maintain the second sample hold circuit 6 in the state holding the analog signal voltage for the (MSB-1) bit.

Figure 10:
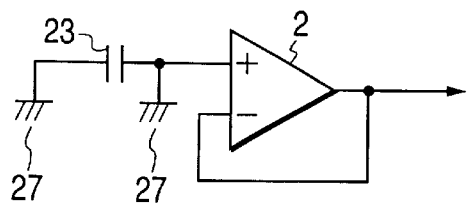

The circuit always has the reset mode prior to the arithmetic operation, to set the initial value of each capacitor. The switch 20 is connected to the ground potential 27, the switch 21 is on to be connected to the ground potential 27, and the switch 22 is switched on to short the output and inverting input terminal of the operational amplifier 2 to fix the operational amplifier 2 in the mode of voltage follower. The switch 9 is connected to the ground potential 27. FIG. 10 is an equivalent circuit diagram upon the reset before the conversion of MSB-1. The both terminals of the first capacitor 23 are connected to the ground potential 27, the inverting input terminal of the operational amplifier 2 is shorted to the output to keep the operational amplifier 2 as a voltage follower, and the non-inverting input terminal of the operational amplifier 2 is connected to the ground potential 27; therefore, the output of the operational amplifier 2 becomes equal to the ground potential 27.

Figure 11:
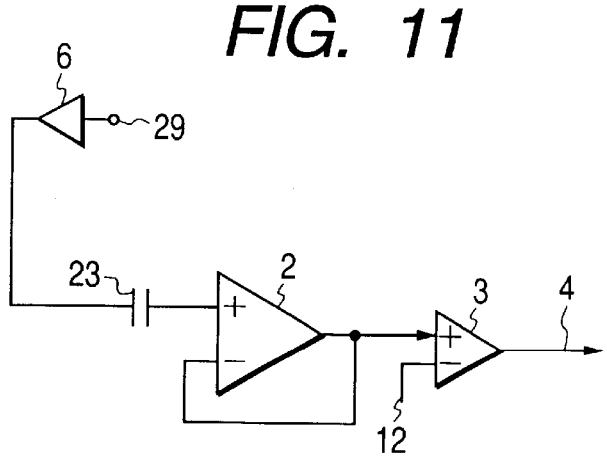

Then the switch 20 is flipped to the side of the switch 8 (i.e., to the output side of the second sample hold circuit 6) to take in the analog signal voltage for the (MSB-1) bit and quantize it. This analog signal input-comparison mode for the (MSB-1) bit is illustrated in FIG. 11. The output of the second sample hold circuit 6 is connected to one terminal of the first capacitor 23, so that the potential of the terminal changes from the ground potential to the analog signal voltage 29 for the (MSB-1) bit input. Since the switch 21, which is connected to the other terminal of the capacitor 23, is switched off, the non-inverting input terminal of the operational amplifier 2 is at high impedance and this point becomes floating. Since the potential at this point changes by the same as the change of the potential at the input terminal of the first capacitor 23, the output of the operational amplifier 2 becomes equal to the analog signal voltage 29 for the (MSB-1) bit. The comparator 3 receives this analog signal voltage for the (MSB-1) bit and compares it with the reference voltage Vref 12, which is the voltage equal to a half of the input analog full range. When the analog signal voltage for the (MSB-1) bit is larger than the reference voltage Vref 12, the comparator outputs "H" to determine the quantization code of MSB-1 to be "1". When the analog signal voltage for the (MSB-1) bit is smaller than the reference voltage Vref 12, the comparator outputs "L" to determine the quantization code of MSB-1 to be "0". Then the comparator outputs the result to the output terminal 4.

Figure 12:
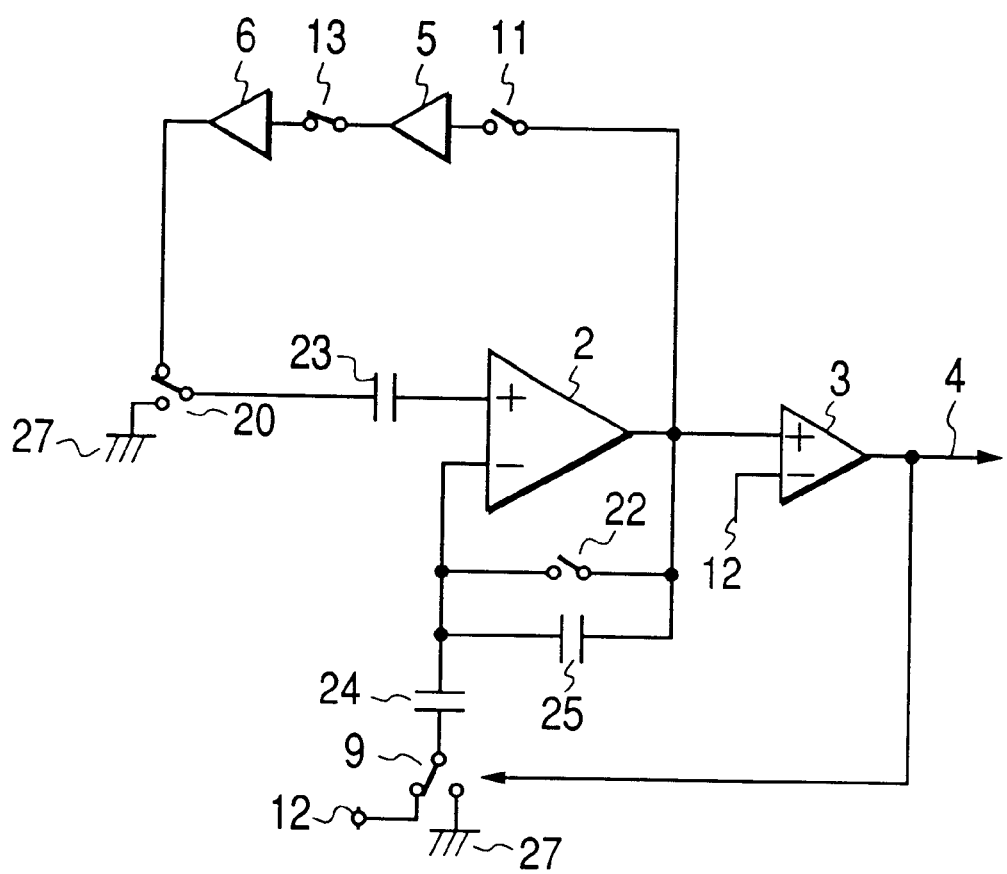

The circuit completes the (MSB-1) bit conversion operation here and, for conversion of the (MSB-2) bit, the circuit moves to the postprocessing and range expansion processing of the (MSB-1) bit analog signal. FIG. 12 is an equivalent circuit diagram of the preparation and range expansion processing mode. The output terminal 4 of the comparator 3 is connected to the control terminal of the switch 9. When the analog signal voltage for the (MSB-1) bit is smaller than the reference voltage Vref 12, "L" is input to the control terminal of the switch 9 to keep the switch 9 in the connected state with the ground potential 27. At this time, the switch 22 is switched off, so that the third capacitor 25 is connected between the inverting input terminal and the output of the operational amplifier 2. The capacitances of the second capacitor 24 and the third capacitor 25 are set equal to each other. At the same time as the off of the switch 22, the gain of the operational amplifier 2 is set to 2, and the operational amplifier 2 thus doubles the analog signal voltage for the (MSB-1) bit used for the conversion of MSB-1 and outputs the result. At this time, the switch 11 is kept on during the transition of from 1 to 2 of the gain of the operational amplifier 2 and is switched off when the output becomes stable after the setting of the gain to 2. This sampling operation causes the first sample hold circuit 5 to hold the voltage equal to double the analog signal voltage for the (MSB-1) bit compared upon the conversion of MSB-1. For circularly feeding the voltage back to the analog input terminal of the AD conversion section upon the quantizing operation of the next lower bit (MSB-2), the analog signal voltage for the (MSB-1) bit held in the first sample hold circuit 5 is transferred to the second hold circuit 6 with the switch 13 being turned on. When the analog signal voltage for the (MSB-1) bit is greater than the reference voltage Vref 12, "H" is input to the control terminal of the switch 9 and thus the switch 9 switches the input from the ground potential 27 to the reference voltage Vref 12. At this point, the switch 22 is switched off, so that the third capacitor 25 is connected between the inverting input terminal and the output of the operational amplifier 2. The capacitances of the second capacitor 24 and the third capacitor 25 are set equal to each other. At the same time as the off of the switch 22, the switch 9 also transitions from the ground potential 27 to the reference voltage Vref 12, and the operational amplifier 2 performs such amplification as to double {(the analog signal voltage for the (MSB-1) bit)−Vref}, which is the result of subtraction of Vref from the analog signal voltage for the (MSB-1) bit. At this time, the switch 11 is kept on during the period in which the floating point of the operational amplifier 2 carries out the calculation of {(the analog signal voltage for the (MSB-1) bit)–Vref} and in which the gain transitions from 1 to 2, and is switched off when the output becomes stable after the setting of the gain to 2. This sampling operation causes the first sample hold circuit 5 to hold the value of double the voltage resulting from the subtraction of Vref from the analog signal voltage for the (MSB-1) bit compared upon the conversion of MSB-1. For circularly feeding the value back to the analog input terminal of the AD conversion section upon the quantizing operation of the next lower bit MSB-2, the switch 13 is switched on to transfer the analog signal voltage for the (MSB-1) bit held in the first sample hold circuit 5, to the sample hold circuit 6.

As described above referring to FIG. 9 to FIG. 12, upon the AD conversion of the (MSB-1) bit using the capacitance-coupled operational amplifier, the input analog signal after the signal amplification with the process gain 1 is compared with the reference voltage Vref 12 and quantized by the comparator 3 and, for processing of the next bit (MSB-2), the analog signal voltage for the (MSB-1) bit undergoes the postprocessing (doing nothing when the quantization code is "0" or performing the subtraction of {(the analog signal voltage for the (MSB-1) bit)–Vref} when the quantization code is "1") and the range expanding process (doubling the analog signal after the postprocessing to match the signal with the scale for the next bit (MSB-2) which next undergoes the AD conversion) and the result is circularly fed back through the sample hold circuits to the input.

The analog signal circuit having undergone the AD conversion in this way is subjected to the range expanding operation, the loop feedback, and again the AD conversion, thus enabling highly accurate successive comparison by the simple circuit configuration. Namely, the present embodiment does not necessitate the DA converter 54 as shown in FIG. 1. With increase in the number of quantization bits of the AD conversion, it was difficult for the circuit shown in FIG. 1 to achieve high accuracy because the accuracy of the AD conversion was determined by the conversion accuracy of the DA converter 54; whereas, in the present embodiment, the accuracy of the AD conversion is determined only by the operation accuracy of the capacitance-coupled operational amplifier and the determination accuracy of the comparator, so that the increase in the number of quantization bits will not result in increasing the quantization errors of the AD conversion, thus realizing the highly accurate successive comparison AD converter of many bits. In the successive comparison AD converter of FIG. 1, the increase in the number of quantization bits resulted in also increasing the number of bits of the internal DA converter 54 to N bits, which increased the circuit scale. In contrast, with the circuit of the present embodiment, the increase in the number of quantization bits does not result in increasing the circuit scale, so that the successive comparison AD converter can be constructed in high integration and with low power consumption.

As detailed above, the present invention realizes the AD converter for successive conversion from the MSB to carry out the following processing by simple hardware: the analog signal after the AD conversion by the signal amplifier and sample hold circuits is subjected to the subtraction and range expanding processes based on the quantization result of a bit of interest to be converted to a processable analog voltage of the next bit and the voltage is fed back to the input to carry out the AD conversion of the next bit, thus permitting the highly accurate successive comparison AD conversion operation by the simple circuit configuration. The circuit is a flexible circuit without increase of the hardware against increase in the number of quantization bits, thus achieving the successive comparison AD converter in high integration and with low power consumption.

What is claimed is:

1. A semiconductor integrated circuit comprising:

signal amplifying means capable of switching a gain to 1 or 2;

arithmetic processing means connected to an input side of the signal amplifying means, said arithmetic processing means carrying out a subtraction process of a reference voltage from a signal input thereto to output a result of the subtraction process, or outputting the signal input thereto without performing the subtraction process;

changeover means having one changeover terminal connected to a signal input terminal and having another changeover terminal connected to an output side of sample hold means, and having a common terminal of connected to an input side of said arithmetic processing means;

a comparator connected to an output side of said signal amplifying means, said comparator comparing an output from said signal amplifying means with the reference voltage to binarize the output; and switch means connecting the output side of said signal amplifying means to an input side of said sample hold means;

wherein said arithmetic processing means carries out a changeover, based on an output from said comparator, so that the subtraction of the reference voltage from the signal input is performed to output the result when the output from said signal amplifying means is larger than the reference voltage, and the signal input is outputted without performing the subtraction when the output from said signal amplifying means is not larger than the reference voltage, and said signal amplifying means amplifies twice the signal resulting from the subtraction of the signal outputted without the subtraction, when the signal inputted into said comparator is not greater than the reference voltage.

2. The semiconductor integrated circuit according to claim 1, wherein the gain of said signal amplifying means is set to 1 in an MSB conversion mode where said changeover means electrically connects said signal input terminal to the input side of said arithmetic processing means.

3. The semiconductor integrated circuit according to claim 1, wherein the gain of said signal amplifying means is set to 2 in a conversion mode except for an MSB conversion mode, where the changeover means electrically connects the output side of said sample hold means to the input side of said arithmetic processing means.

4. The semiconductor integrated circuit according to claim 1, wherein after such an operation that a signal before AD conversion is applied to said signal input terminal, that the signal is amplified by a factor of 1 or 2 by said signal amplifying means, and that a binary comparison operation of said comparator is completed, said switch means is switched on, whereby either after execution of the subtraction process of subtracting a signal of said reference voltage from said signal before the AD conversion when the output of the comparator is active or after execution of an arithmetic process of not performing the subtraction process of the signal of said reference voltage from said signal before the AD conversion when the output of the comparator is non-active, an output from said signal amplifying means is supplied to said sample hold means.

5. The semiconductor integrated circuit according to claim 1, wherein when said switch means is first switch means, said sample hold means comprises a first hold circuit and a second hold circuit connected through second switch means thereto, wherein when the first switch means is on, the second switch means is off, and wherein when said first switch means is off, the second switch means is on.

6. A semiconductor integrated circuit comprising:
    signal amplifying means capable of switching a gain to 1 or 2 and capable of performing a changeover between performing a subtraction process of a reference voltage from a signal input thereto to output a result of said subtraction process and outputting the signal input thereto without performing the subtraction process;
    changeover means who one changeover terminal is connected to a signal input terminal and whose other changeover terminal is connected to an output side of sample hold means, a common terminal of said changeover means being connected to an input side of said signal amplifying means;
    a comparator connected to an output side of said signal amplifying means, said comparator comparing an output from said signal amplifying means with the reference voltage to binarize the output; and
    switch means connecting the output side of said signal amplifying means to an input side of said sample hold means;
    wherein said signal amplifying means carries out the changeover between performing the subtraction process of the reference voltage from the signal input thereto to output the result and outputting the signal input thereto without performing the subtraction process, based on an output from said comparator.

7. The semiconductor integrated circuit according to claim 6, wherein the gain of said signal amplifying means is set to 1 in an MSB conversion mode where said changeover means electrically connects said signal input terminal to the input side of said signal amplifying means.

8. The semiconductor integrated circuit according to claim 6, wherein the gain of said signal amplifying means is set to 2 in a conversion mode except for an MSB conversion mode, where the changeover means electrically connects the output side of said sample hold means to the input side of said signal amplifying means.

9. The semiconductor integrated circuit according to claim 6, wherein after such an operation that a signal before AD conversion is applied to said signal input terminal, that the signal is amplified by a factor of 1 or 2 by said signal amplifying means, and that a binary comparison operation of said comparator is completed,
    said switch means is switched on, whereby either after execution of the subtraction process of subtracting a signal of said reference voltage from said signal before the AD conversion when the output of the comparator is active or after execution of an arithmetic process of not performing the subtraction process of the signal of said reference voltage from said signal before the AD conversion when the output of the comparator is not-active, an output from said signal amplifying means is supplied to said sample hold means.

10. The semiconductor integrated circuit according to claim 6, wherein when said switch means is first switch means, said sample hold means comprises a first hold circuit and a second hold circuit connected through second switch means thereto, wherein when the first switch means is on, the second switch means is of, and wherein when said first switch means is off, the second switch means is on.

11. A method for driving a semiconductor integrated circuit comprising:
    signal amplifying means capable of switching a gain to 1 or 2;
    arithmetic processing means connected to an input side of the signal amplifying means, said arithmetic processing means carrying out a subtraction process of a reference voltage from a signal input thereto to output a result of the subtraction process, or outputting the signal input thereto without performing the subtraction process;
    changeover means having one changeover terminal connected to a signal input terminal and having another changeover terminal connected to an output side of sample hold means, and having a common terminal connected to an input side of said arithmetic processing means;
    a comparator connected to an output side of said signal amplifying means, said comparator comparing an output from said signal amplifying means with the reference voltage to binarize the output; and
    switch means connecting the output side of said signal amplifying means to an input side of said sample hold means;
    wherein said arithmetic processing means carries out a changeover, based on an output from said comparator, so that the subtraction of the reference voltage from the signal input is performed to output the result when the output from said signal amplifying means is larger than the reference voltage, and the signal input is outputted without performing the subtraction when the output from said signal amplifying means is not larger than the reference voltage, and
    wherein said signal amplifying means amplifies twice the signal resulting from the subtraction of the signal input into said arithmetic processing means, or the signal outputted without the subtraction when the signal inputted into said comparator is not greater than the reference voltage, and
    said driving method comprising an MSB (Most Significant Bit) conversion mode in which the gain of said signal amplifying means is set to 1, and said changeover means electrically connects said signal input terminal to the input side of said arithmetic processing means or said signal amplifying means.

12. The method according to claim 11, wherein in a conversion mode except for said MSB conversion mode, the gain of said signal amplifying means is set to 2.

13. The driving method according to claim 11, comprising a step wherein after such an operation that a signal before AD conversion is applied to said signal input terminal, that the signal is amplified by a factor of 1 or 2 by said signal amplifying means, and that a binary comparison operation of said comparator is completed,
    said switch means is switched on, whereby either after execution of the subtraction process of subtracting a signal of said reference voltage from said signal before the AD conversion when the output of the comparator is active or after execution of an arithmetic process of not performing the subtraction process of the signal of said reference voltage from said signal before the AD conversion when the output of the comparator is non-active, an output from said signal amplifying means is supplied to said sample hold means.

14. The driving method according to claim 11, wherein when said switch means is first switch means, said sample hold means comprises a first hold circuit and a second hold circuit connected through second switch means thereto, wherein when the first switch means is on, the second switch means is off, and wherein when said first switch means is off, the second switch means is on.

15. A method for driving a semiconductor integrated circuit comprising:

signal amplifying means capable of switching a gain and capable of performing a changeover between performing a subtraction process of a reference voltage from a signal input thereto to output a result of said subtraction process and outputting the signal input thereto without performing the subtraction process;

changeover means whose one changeover terminal is connected to a signal input terminal and whose other changeover terminal is connected to an output side of sample hold means, a common terminal of said changeover means being connected to an input side of said signal amplifying means;

a comparator connected to an output side of said signal amplifying means, said comparator comparing an output from said signal amplifying means with the reference voltage to binarize the output; and switch means connecting the output side of said signal amplifying means to an input side of said sample hold means;

wherein said signal amplifying means carries out the changeover between performing the subtraction process of the reference voltage from the signal input thereto to output the result and outputting the signal input thereto without performing the subtraction process, based on an output from said comparator, said driving method comprising an MSB (Most Significant Bit) conversion mode in which the gain of said signal amplifying means is set to 1 and said changeover means electrically connected said signal input terminal to the input side of said signal amplifying means.

16. The method according to claim 15, wherein in a conversion mode except for said MSB conversion mode, the gain of said signal amplifying means is set to 2.

17. The driving method according to claim 15, comprising a step wherein after such an operation that a signal before AD conversion is applied to said signal input terminal, that the signal is amplified by a factor of 1 or 2 by said signal amplifying means, and that a binary comparison operation of said comparator is completed, said switch means is switched on, whereby either after execution of the subtraction process of subtracting a signal of said reference voltage from said signal before the AD conversion when the output of the comparator is active or after execution of an arithmetic process of not performing the subtraction process of the signal of said reference voltage from said signal before the AD conversion when the output of the comparator is non-active, an output from said signal amplifying means is supplied to said sample hold means.

18. The driving method according to claim 15, wherein when said switch means is first switch means, said sample hold means comprises a first hold circuit and a second hold circuit connected through second switch means thereto, wherein when the first switch means is on, the second switch means is off, and wherein when said first switch means is off, the second switch means is on.

* * * * *

UNITED STATES PATENT AND TRADEMARK OFFICE
CERTIFICATE OF CORRECTION

PATENT NO.    : 6,259,393 B1
DATED         : July 10, 2001
INVENTOR(S)   : Katsuhisa Ogawa et al.

It is certified that error appears in the above-identified patent and that said Letters Patent is hereby corrected as shown below:

Title page,
Item [57] ABSTRACT,
Line 4, "of" ($2^{nd}$ occurrence) should be deleted.

Column 1,
Line 16, "are" should read -- is --.
Line 38, "control" should be deleted.

Column 5,
Line 44, "process etc." should read -- process, etc., --.

Column 6,
Line 38, "output 4" should read -- output terminal 4 --.

Column 11,
Line 45, "is" should read -- is switched --.

Column 14,
Line 18, "of" should be deleted.

Column 15,
Line 17, "who" should read -- whose --.

Column 18,
Line 4, "connected" should read -- connects --.

Signed and Sealed this

Fifth Day of March, 2002

*Attest:*

JAMES E. ROGAN
*Attesting Officer*       *Director of the United States Patent and Trademark Office*